(12) United States Patent
Chien et al.

(10) Patent No.: US 7,231,196 B2
(45) Date of Patent: Jun. 12, 2007

(54) METHOD AND APPARATUS FOR FRACTIONAL-N SYNTHESIS

(75) Inventors: Hung-Ming Chien, Los Angeles, CA (US); Meng-An Pan, Cerritos, CA (US); Stephen Wu, Los Angeles, CA (US); Brima Ibrahim, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 1119 days.

(21) Appl. No.: 10/015,993

(22) Filed: Dec. 12, 2001

(65) Prior Publication Data

US 2003/0109237 A1 Jun. 12, 2003

(51) Int. Cl.
*H04B 7/00* (2006.01)
*H04B 1/18* (2006.01)

(52) U.S. Cl. .................................. 455/260; 455/165.1

(58) Field of Classification Search .............. 455/260, 455/165.1, 313, 76
See application file for complete search history.

(56) References Cited

U.S. PATENT DOCUMENTS 5,187,722 A * 2/1993 Petty ........................ 375/371
5,774,023 A * 6/1998 Irwin ........................... 331/17
7,092,675 B2 * 8/2006 Lim et al. ..................... 455/76
2002/0121938 A1 * 9/2002 Fan ............................ 331/16

OTHER PUBLICATIONS

"A 27-mW CMOS Fractional-N Synthesizer Using Digital Compensation for 2.5Mb/s GFSK Modulation", Michael H. Perrott, Student Member, IEEE, Theodore L. Tewksbury III, Member, IEEE, and Charles G. Sodini, Fellow, IEEE—IEEE Journal of Solid-State Circuits, vol. 32, No. 12, Dec. 1997.

* cited by examiner

*Primary Examiner*—Barry Taylor
(74) *Attorney, Agent, or Firm*—Garlick Harrison & Markison; James A. Harrison

(57) ABSTRACT

A method and apparatus for fractional-N synthesis includes processing that begins by generating a $1^{st}$ feedback frequency from the output frequency based on a fixed divider value. The processing continues by generating a $2^{nd}$ feedback frequency from the output frequency based on a selectable divider value, a modified fractional value of the divider value, and a modified integer value of the divider value. The processing continues by determining whether the fractional value of the divider value is within a range of fractional values. If so, the $1^{st}$ feedback frequency is used to produce the output. If the fractional portion of the divider value is not within the range of fractional values, the $2^{nd}$ feedback frequency is used to produce the output frequency.

41 Claims, 7 Drawing Sheets

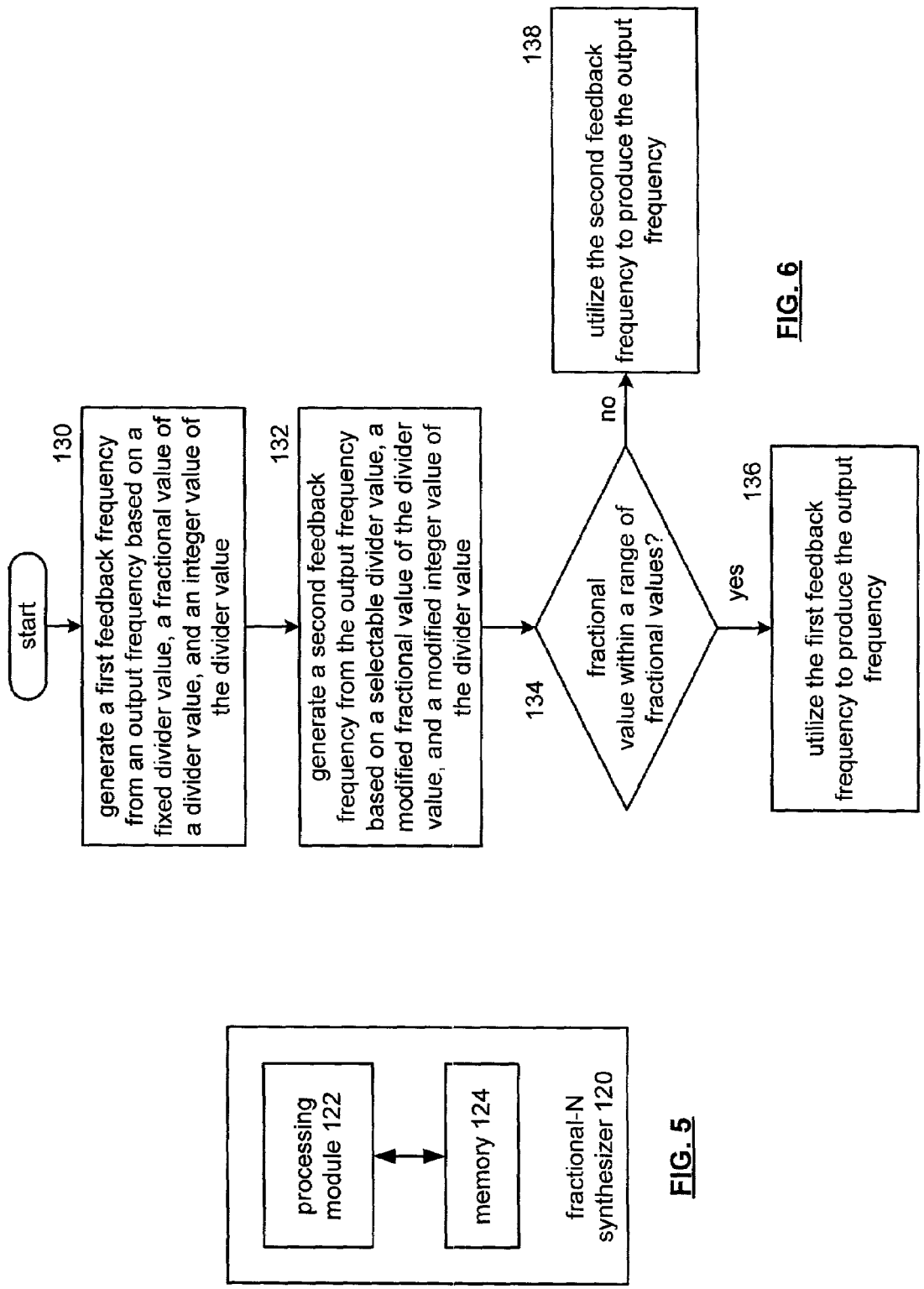

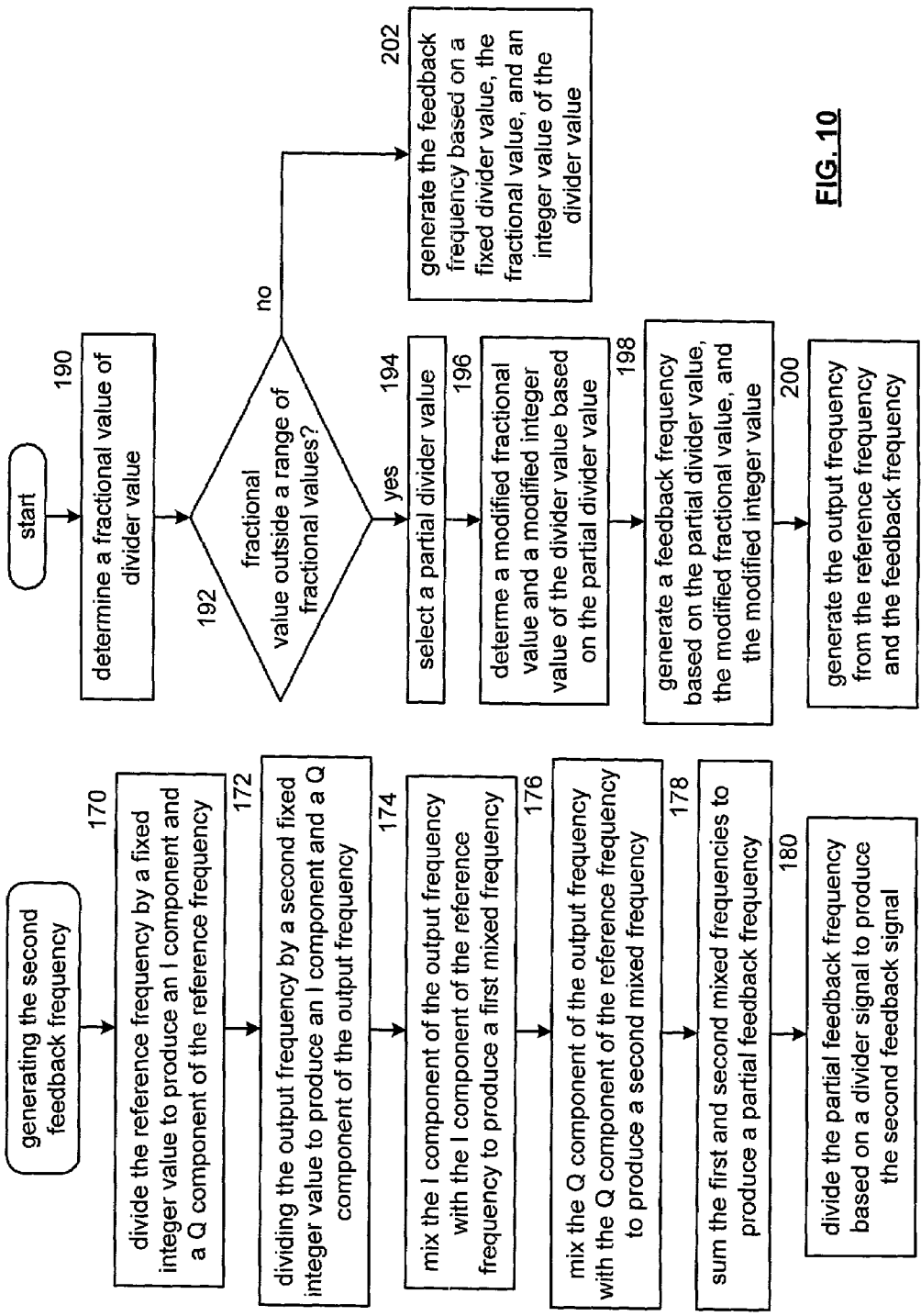

METHOD AND APPARATUS FOR FRACTIONAL-N SYNTHESIS

TECHNICAL FIELD OF THE INVENTION

This invention relates generally to wireless communications and more particularly to local oscillations used within wireless communication devices.

BACKGROUND OF THE INVENTION

The use of wireless communications for in-home, in-building networks, and direct communications, is increasing in popularity and spawning relatively new standards including, but not limited to Bluetooth, IEEE 802.11a, IEEE802.11b, et cetera. As is known for wireless communications, data is modulated onto at least one radio frequency (RF) carrier frequency and transmitted as a modulated signal by a radio transmitter. A radio receiver receives the RF modulated signal and demodulates it to recapture the data.

As is further known, there are a variety of modulation/demodulation protocols that may be used for wireless communications. Such modulation/demodulation protocols include amplitude modulation (AM), frequency modulation (FM), amplitude shift-keying (ASK), frequency shift-keying (FSK), phase shift-keying (PSK), orthogonal frequency division multiplexing (OFDM), or variations thereof. As is also know, Bluetooth utilizes an FSK modulation/demodulation protocol while IEEE 802.11a and IEEE802.11b utilize a form of PSK and/or OFDM modulation/demodulation protocol.

Regardless of the particular modulation/demodulation protocol, a radio receiver generally includes an antenna section, a filtering section, a low noise amplifier, an intermediate frequency (IF) stage, and a demodulator. In operation, the antenna section receives RF modulated signals and provides them to the filtering section, which passes RF signals of interest to the low noise amplifier. The low noise amplifier amplifies the received RF signals of interest and provides them as amplified signals to the IF stage. The IF stage includes one or more local oscillators, one or more mixers, and one or more adders to step-down the frequency of the RF signals to an intermediate frequency signals or to base-band signals. The IF stage provides the IF or base-band signals to the demodulator, which, based on the particular modulation/demodulation protocol, demodulates the signals to recapture the data.

Local oscillators within the IF stage are generally implemented using a phase locked loop (PLL) to produce a local oscillation from a reference frequency. As is known, a PLL includes a phase detector, charge pump, voltage controlled oscillator (VCO), and a divider feedback. The phase detector is operably coupled to produce a signal that represents a phase difference and/or frequency difference between a reference frequency and a feedback frequency. In many applications, a crystal oscillator generates the reference frequency, which may be in the range of 10 to 20 MHz. The feedback divider produces the feedback frequency by dividing the output frequency by a divider value. For example, if the crystal oscillator frequency is 20 MHz and the desired output frequency (i.e., the output of the VCO) is 1600 MHz, the divider feedback divides the output frequency by 80 to produce a 20 MHz feedback frequency.

When the phase and frequency of the reference frequency and feedback frequency substantially match, the PLL is locked, thus producing the desired output frequency. If the phase and/or frequency of the reference frequency differs from the phase and/or frequency of the feedback frequency, the phase detector produces a charge-up signal or a charge-down signal depending on whether the feedback frequency is too slow or too fast with respect to the reference frequency. The voltage controlled oscillator receives the charge-up or charge-down signal and increases the output frequency for a charge-up signal and decreases the output frequency for a charge-down signal. This continues until the PLL is locked.

Such a basic PLL produces a fixed output frequency (i.e., fixed local oscillation), but in many wireless applications, an adjustable local oscillation is needed. For example, in a Bluetooth wireless application, the local oscillation must have a range of 2400 MHz to 2484 MHz. To achieve this, a PLL is modified to include a selectable divider feedback that is capable of producing divider values that include an integer portion and a fractional portion. To select a particular divider value, the PLL includes a Sigma Delta modulator, which generates a digital signal that represents the fractional portion. For example, to generate a 2484 MHz local oscillation from a 20 MHz reference frequency, a divider value of 124.4 is needed. As such, the digital signal produced by the Sigma Delta modulator causes the adjustable divider feedback to jump between a $1^{st}$ value (e.g., 124) and a $2^{nd}$ value (e.g., 125) such that an average of 124.4 is obtained.

An issue arises with such Sigma Delta modulator circuits when the divider value is near an integer value (i.e., the fractional value is very small, e.g., 0.03 or less or is very large, e.g., 0.97 or greater). When this is the case, the Sigma Delta modulator produces very little modulation, which causes the PLL to generate fractional spurs. Such fractional spurs adversely affect the local oscillator and hence adversely affect the radio receiver and/or radio transmitter.

A further issue with PLL based local oscillators, which also adversely affect the radio receiver and/or radio transmitter is transmitter pulling. This results when the voltage controlled oscillator output is at a frequency that is substantially equal to the carrier frequency.

Therefore, a need exists for a PLL based adjustable local oscillator that overcomes transmitter pulling and substantially eliminates the generation of fractional spurs.

BRIEF DESCRIPTION OF THE DRAWINGS

FIG. 5 illustrates a schematic block diagram of yet another fractional-N synthesizer in accordance with the present invention;

FIGS. 6 through 9 illustrate a logic diagram of a method for fractional-N synthesis in accordance with the present invention; and FIG. 10 illustrates a logic diagram of an alternate method for fractional-N synthesis in accordance with the present invention.

DETAILED DESCRIPTION OF A PREFERRED EMBODIMENT

Generally, the present invention provides a method and apparatus for fractional-N synthesis. Such a method and apparatus includes processing that begins by generating a 1st feedback frequency from the output frequency based on a fixed divider value. The processing continues by generating a 2nd feedback frequency from the output frequency based on a selectable divider value, a modified fractional value of the divider value, and a modified integer value of the divider value. The processing continues by determining whether the fractional value of the divider value is within a range of fractional values. If so, the 1st feedback frequency is used to produce the output. In this instance, the fractional portion of the divider value is far enough away from an integer value to avoid the production of fractional spurs. If the fractional portion of the divider value is relatively close to an integer value where fractional spurs may result, the 2nd feedback frequency is used to produce the output frequency. The 2nd feedback frequency is produced utilizing a modified divider value, which has a fractional component that is substantially away from an integer value to avoid the generation of fractional spurs. With such a method and apparatus, a local oscillator that includes a PLL for use in an integrated radio circuit may be produced that avoids the generation of fractional spurs and transmitter pulling.

Figure 1:
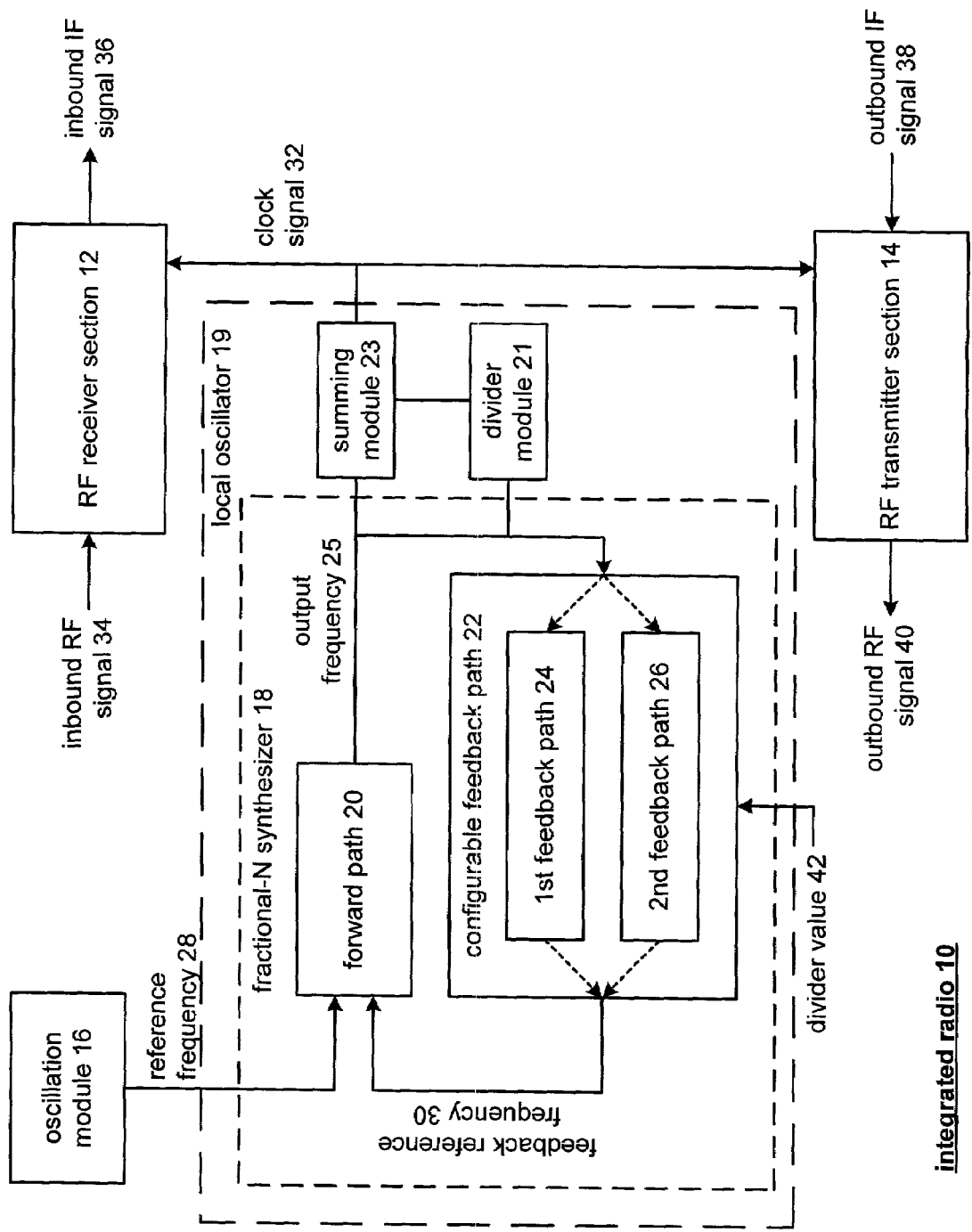
FIG. 1 illustrates a schematic block diagram of an integrated radio in accordance with the present invention.

The present invention can be more fully described with reference to FIGS. 1 through 10. FIG. 1 illustrates a schematic block diagram of an integrated radio 10 that may be implemented on an integrated circuit. The integrated radio 10 includes a radio frequency receiver section 12, a radio frequency transmitter section 14, an oscillation module 16, and a local oscillator 19. The RF receiver section 12 is operably coupled to convert an inbound radio frequency signal 34 into an inbound IF signal 36. For example, the RF receiver section 12 may be converting an RF signal 34 into an inbound IF signal 36 in accordance with the Bluetooth specification, IEEE 802.11a specification, IEEE802.11b, code division multiple access (CDMA), analog mobile phone service (AMPS), digital amps, global system for mobile (GSM), wireless application protocol (WAP) and/or any other wireless communication standard. Note that the RF receiver section 12 may include multiple receivers each operable to convert the RF signal into an IF signal 36 in accordance with a particular one of the previously mentioned wireless communication standards.

The RF transmitter section 14 is operably coupled to convert an outbound IF signal 38 into an outbound RF signal 40. Such a conversion is dependent on the particular wireless communication standard being implemented by the integrated radio 10. As previously mentioned, the wireless communication specification may be Bluetooth, IEEE 802.11a, IEEE802.11b, et cetera. Accordingly, the outbound IF signal 38 would be produced in accordance with one of the specifications and up-converted to the RF transmitter section 14 in accordance with the particular standard. As one of average skill in the art will appreciate, the RF transmitter section 14 may include multiple transmitter sections for implementing multiple wireless communication standards.

The oscillation module 16 may include a crystal oscillator that produces a 10 to 20 MHz reference frequency 28. The oscillation module 16 may also include a sine-wave generator to produce the reference frequency 28. As one of average skill in the art will appreciate, the oscillation module 16 is a device that produces a sinusoidal reference frequency 28.

Figure 2:
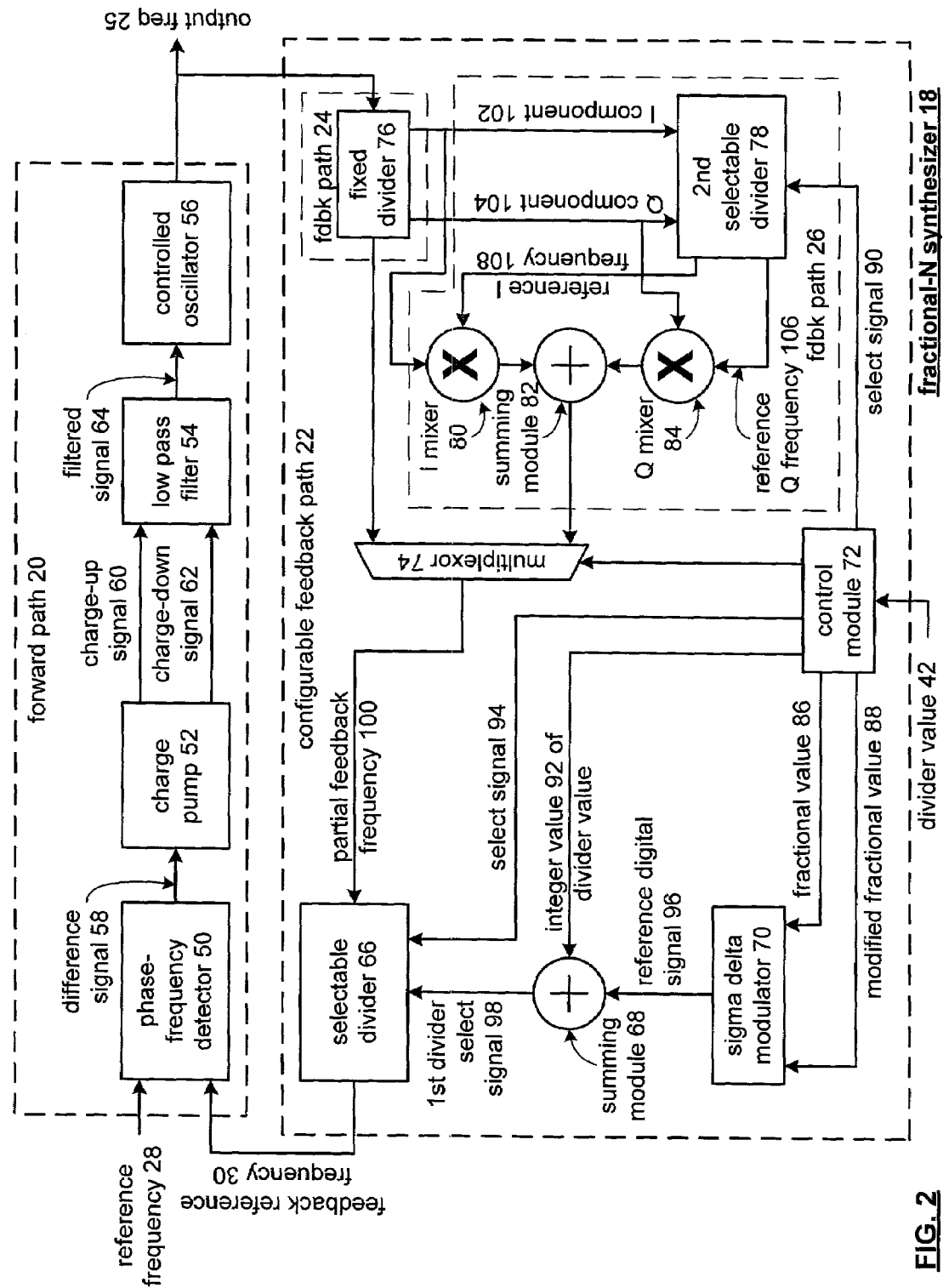
FIG. 2 illustrates a schematic block diagram of a fractional-N synthesizer in accordance with the present invention.

The local oscillator 19 includes a fractional-N synthesizer 18, a divider module 21, and a summing module 23. The fractional-N synthesizer 18 includes a forward path 20 and a configurable path 22. The configurable path 22 includes a 1st feedback path 24 and a 2nd feedback path 26. The forward path 20, which will be described in greater detail with reference to FIG. 2, compares the reference frequency 28 with the feedback reference frequency 30 to produce an output frequency 25. The divider module 21 divides the output frequency 25 to produce a divided frequency. The summing module 23 sums the output frequency with the divided frequency to produce a clock signal 32, i.e., a local oscillation. In one embodiment, the output frequency is ⅔ of the frequency of the clock signal 32 and the divider module 21 is a divide by 2 module. As such, the divided frequency is ⅓ of the frequency of the clock signal 32. Thus, when the output frequency and divided frequency are summed together, the clock signal 32 is produced. The clock signal 32 is provided to both the RF receiver section 12 and the RF transmitter section 14. For example, for a Bluetooth application, which requires a local oscillation (i.e., clock signal 32), of 2400 MHz to 2484 MHz, the output frequency 25 will range from 1600 MHz to 1654.66 MHz.

The configurable feedback path 22, based on a divider value 42, produces the feedback reference frequency 30. In many applications, the divider value 42 will be a whole number that includes an integer portion and a fractional portion. When the fractional portion is very small or very large (e.g., the divider value 42 includes a fractional portion of 0.03 or less or includes a fractional portion of 0.97 or greater, i.e., is very close to an integer value) the 2nd feedback path 26 will be utilized. When the divider value 42 is not substantially close to an integer value (e.g., the fractional portion is in the range of 0.03 to 0.97) the 1st feedback path 24 will be utilized. As will be discussed in greater detail with reference to FIGS. 2 through 10, the 1¹st feedback path 24 includes a fixed divider and a selectable divider to produce the feedback reference frequency 30 directly from the divider value 42.

The 2nd feedback path 26 includes a configurable divider section, which allows components of the divider value 42 to be modified to include a fractional portion that is within an acceptable range of fractional values. The resulting feedback reference frequency 30 is the same whether the 1st feedback path 24 or the 2nd feedback path 26 is utilized. However, the divider components of the 2nd feedback path 26 are different than the divider components of the 1st feedback path 24, which allows the divider value to be modified such that the fractional spurs that result when the fraction portion of the divider value is very large or very small are substantially avoided.

FIG. 2 illustrates a schematic block diagram of the fractional-N synthesizer 18, which includes the forward path 20 and the configurable path 22. The forward path 20 includes a phase/frequency detector 50, a charge pump 52, a low pass filter 54 and a controlled oscillator 56, which may be a voltage controlled oscillator or current controlled oscillator. The components of the forward path 20 function in a similar manner to those in a phase locked loop. As such, the phase/frequency detector 50 receives the reference frequency 20 and the feedback reference frequency 30 and produces a difference signal 58 therefrom. The difference signal 58 indicates a phase and/or frequency difference between the reference frequency 28 and the feedback reference frequency 30. The charge pump 52 converts the difference signal 58 into either a charge-up signal 60 or a charge-down signal 62. The low pass filter 54 filters the charge-up signal 60 or the charge-down signal 62 to produce a filtered signal 64. The controlled oscillator 56 generates the output frequency 25 based on the filtered signal 64.

The configurable feedback path 22 generates the feedback reference frequency 30 from the output frequency 25. The configurable feedback path 22 includes the 1st feedback path 24, the 2nd feedback path 26, a multiplexor 74, control module 72, Sigma Delta modulator 70, summing module 68, and a selectable divider 66. The 1st feedback path 24 includes a fixed divider 76. The 2nd feedback path 26 includes a 2nd selectable divider 78, a Q mixer 84, an I mixer 80, and a summing module 82.

The control module 72 is operably coupled to receive and/or determine the divider value 42 based on the reference frequency 28, the output frequency 25, the divider value of the fixed divider 76, and/or the selectable divider value of the $2^{nd}$ selectable divider 78. When the fractional component of divider value 42 is with the range of fractional values (e.g., between 0.03 and 0.97), the control module 72 generates select signal 94 and provides the fractional value 86 to Sigma Delta modulator 70 and the integer value of the divider value to summing module 68. In addition, the control module 72 provides a select signal to multiplexor 74, which selects the output of the $1^{st}$ feedback path 24. When the fractional component of divider value 42 is not with the range of fractional values (e.g., outside of 0.03 to 0.97), the control module 72 generates select signal 90 and 94 and provides a modified fractional value 88 to Sigma Delta modulator 70 and the integer value of the modified divider value to summing module 68. In addition, the control module 72 provides a select signal to multiplexor 74, which selects the output of the $2^{nd}$ feedback path 26.

As an example of the functionality of the configurable feedback path, assume that the reference frequency 28 is a 20 MHz signal and the desired output frequency 25 is 1654.66 MHz. As such, to achieve a 1654.66 MHz output frequency from a 20 MHz reference frequency 28, a divider value of 82.733 is needed. Further assume that the fixed divider 76 provides a divide by 2. As such, the needed divider value 42 is 82.733/2=41.367. In this instance, the control module 72 interprets the divider value 42 (e.g., 41.367) to determine whether it is substantially equal to an integer value. The control module 72 analyzes the fraction of the portion of the divider value to determine whether it is less than 0.03 or greater than 0.97. For this particular example, the fractional value is 0.367, which is within the range of acceptable values. Recall that if the divider value 42 is substantially equal to an integer value (i.e., the fractional value is 0.03 or less or is 0.97 or greater), the modulation produced by the Sigma Delta modulator 70 is relatively small, which can cause fractional spurs in the output frequency 25.

For this example, the control module 72 determines that the divider value 42 of 41.367 is substantially different from an integer value. As such, the control module 72 enables multiplexor 74 to output the feedback from the $1^{st}$ feedback path 24. As shown, the $1^{st}$ feedback path 24 includes the fixed divider 76, which, for this example is a divided by 2 divider. As such, the multiplexor 74 outputs, as a partial feedback frequency 100, the output of fixed divider 76. In addition, the control module 72 provides the fractional value 86 (e.g., 0.367) to the Sigma Delta modulator 82 and the integer value 92 of the divider value 42 (e.g., 41) to the summing module 68.

The Sigma Delta modulator 70 produces a modulation, or reference digital signal 96, that is a bit stream of zeros and ones, which, over time, averages to the fractional value 86 (for this example, 0.367). The summing module 68 sums the reference digital signal 96 with the integer value 92 to produce a $1^{st}$ divider select signal 98. The selectable divider 66, which may have a divider range from divide by 32 to divide by 127, receives the $1^{st}$ divider select signal 98. Based on the $1^{st}$ divider select signal 98, the particular divider value of the selectable divider 66 is chosen. Since the divider value needed for selectable divider 66 includes a fractional portion, the selectable divider 66 will toggle between two divider values. For example, with the fixed divider 76 providing a divide by 2, the selectable divider 66 needs to produce a divide by 41.367 to achieve the desired divide by 82.733. As such, the $1^{st}$ divider selects signal 98 will cause the selectable divider 66 to toggle between divide by 41 and divide by 42 such that the average divider produced by selectable divider 66 is 41.367.

As an alternate example, assume that the frequency of the reference frequency 28 is 19.999 MHz and the desired output frequency 25 is 1600 MHz. To achieve this, the configurable feedback path 20 needs to divide the output frequency by 80.004. The control module 72 interprets the divider value 42 if the first path were used, which for this example is 40.002 (assuming the fixed divider is a divide by 2 divider), and determines that it is too close to an integer value. As such, the control module 72 will generate select signal 90 and enables the multiplexor 74 to output, as the partial feedback frequency 100, the output of the $2^{nd}$ feedback path 26. The control module 72 selects one of a variety of divider values within the $2^{nd}$ selectable divider 78 via the select signal 90. For example, the select signal 90 may cause the $2^{nd}$ selectable divider 78 to function as a divide by 4, divide by 5, or divide by 6 divider.

The control module 72 selects the divide by value to insure that the modified divider value 42 includes a fractional value within the desired range (e.g., 0.03–0.97). In this example, if divide by 4 is selected, the divider value is 20.001 (e.g., 80.004/4). As such, the divide by 4 does not provide a desirable fractional portion, thus it is not chosen. If the divide by 5 is selected, the divider value 42 is 16.0008 (80.004/5). As such, the divide by 5 does not provide a desirable fractional portion, thus it is not chosen. If the divide by 6 is selected, the divider value is 13.334 (e.g., 80.004/6). This selection provides an acceptable fractional value. Accordingly, the select signal causes the $2^{nd}$ selectable divider to function as a divide by 6 divider. Note that if the reference clock 28 produces a 20 MHz clock and the desired output frequency is 1600 MHz, the overall divider is 80. In this instance, the sigma delta modulator 70 could be disabled, such that the $1^{st}$ feedback path 24 is configured to provide the divide by 80 value.

With the divider value selected for example of 19.999 MHz reference clock, the $2^{nd}$ selectable divider 78 divides the Q component 104 and the I component 106 of the output frequency, which may be produced by the fixed divider 76, to generate a reference I frequency 108 and a reference Q frequency 106. The frequency of the reference I and reference Q will be, for this example, $\frac{1}{6}^{th}$ of the frequency of the I and Q components 102 and 104 of the output frequency. The I mixer 80 mixes the reference I frequency 108 with the I component 102 of the output of fixed divider 76. The Q mixer 84 mixes the reference Q frequency 106 with the Q component 104. The summing module 82 sums the outputs of the I mixer 80 and Q mixer 84 to produce the partial feedback frequency 100. In this instance, the partial feedback frequency 100 represents a divide by 6 representation of the output frequency 25. As such, the selectable divider 66 needs to produce a 13.334 divisor to achieve the desired divide by 80.004.

To produce the divide by 13.334 value, the control module 72 provides a modified fractional value 88 (e.g., 0.334) to the Sigma Delta modulator 70 and the integer value of 13 to the summing module 68. The Sigma Delta modulator 70 produces the reference signal 96 from the modified fraction value 88. The summing module sums the reference digital signal 96 and the integer value of the modified divider value to produce the $1^{st}$ divider select signal 98. Based on this input, the selectable divider 66 produces a divider value of 13.334. As such, utilizing the $2^{nd}$ feedback path 26 and modifying the divider values provided to the Sigma Delta modulator 70, the selectable divider 66 outputs the feedback reference frequency 30 without the potential of producing fractional spurs as would have been the case if the $1^{st}$ feedback path 24 had been used for this particular example.

Figure 3:
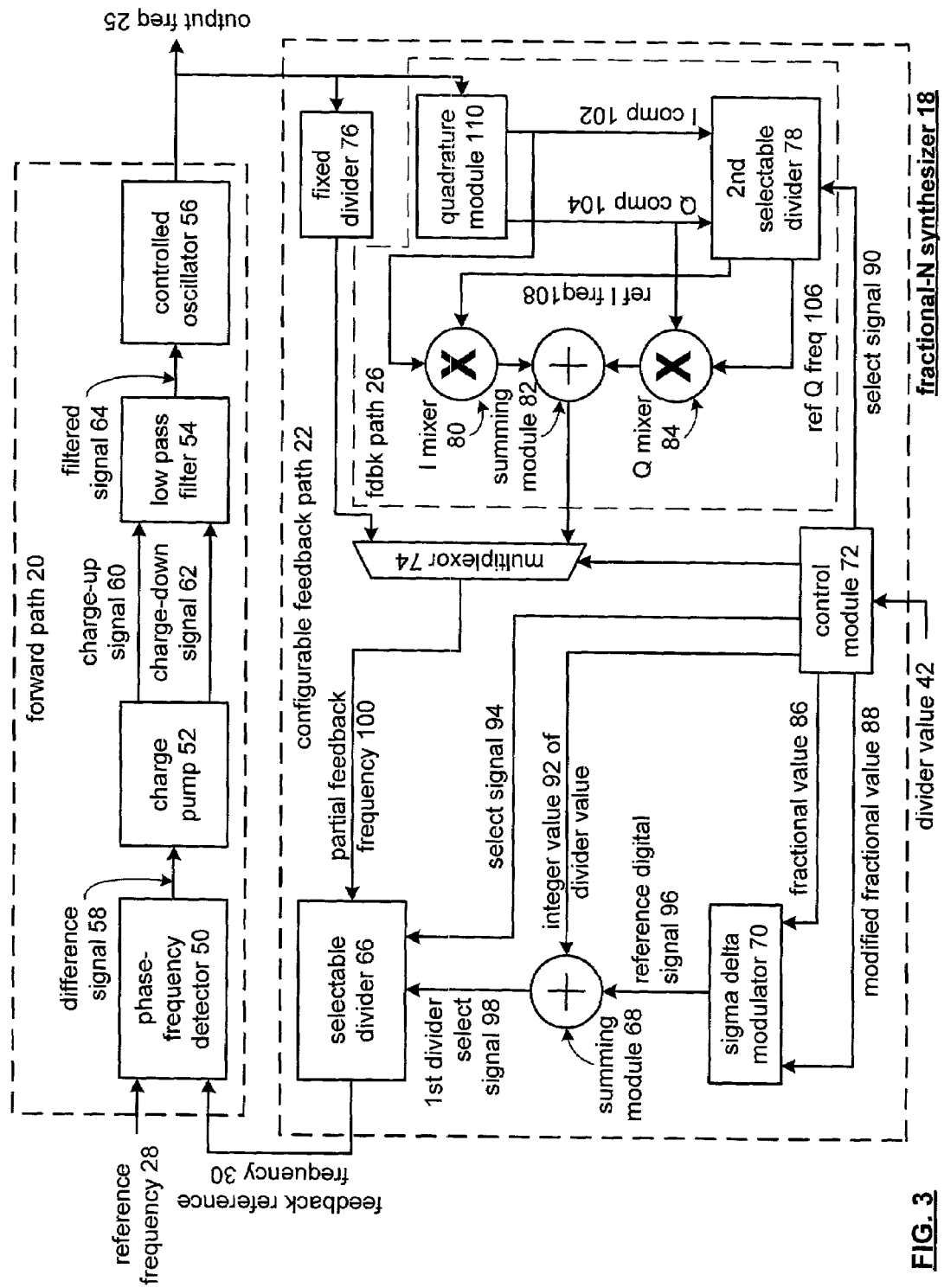
FIG. 3 illustrates a schematic block diagram of an alternate fractional-N synthesizer in accordance with the present invention.

FIG. 3 illustrates a schematic block diagram of an alternate fractional-N synthesizer 18. The fractional-N synthesizer 18 includes the forward path, which operates as previously discussed with reference to FIG. 2, and the configurable feedback path 22. In this example, the configurable feedback path 22 includes the control module 72, multiplexor 74, selectable divider 66, summing module 68 and Sigma Delta modulator 70. These components function as previously described with reference to FIG. 2. The $1^{st}$ feedback path 24 includes the fixed divider 76, which also functions as previously described with reference to FIG. 2. The $2^{nd}$ feedback path 26 includes a quadrature module 110, the $2^{nd}$ selectable divider 78, the Q mixer 84, the summing module 82 and the I mixer 80.

The quadrature module 110 is operably coupled to receive the output frequency 25 and produce an I component 102 and a Q component 104 of the output frequency. At this point, the functionality of the $2^{nd}$ feedback path 26 is as previously discussed with reference to FIG. 2.

Figure 4:
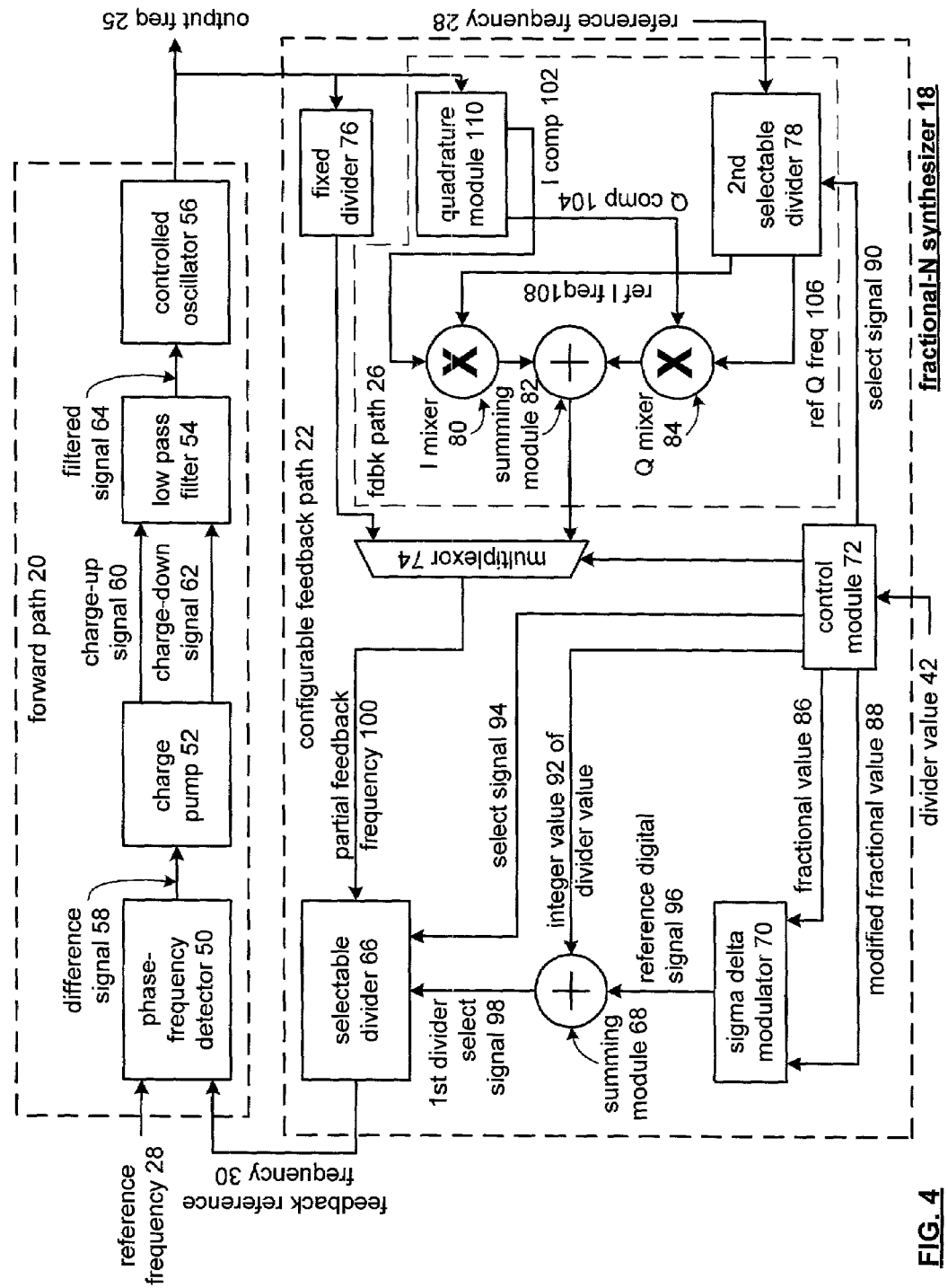
FIG. 4 illustrates a schematic block diagram of another fractional-N synthesizer in accordance with the present invention.

FIG. 4 illustrates a schematic block diagram of another fractional-N synthesizer 18 and includes the forward path 20 and the configurable feedback path 22. The forward path 20 functions as previously described with reference to FIG. 2. The configurable feedback path includes the fixed divider 76, multiplexor 74, control module 72, Sigma Delta modulator 70, summing module 68 and selectable divider 66. These components function as previously described with reference to FIG. 2.

The $2^{nd}$ feedback path 26 includes the quadrature module 110, the selectable divider 78, the I mixer 80, summing module 82 and Q mixer 84. The quadrature module 110 is operably coupled to produce an I component 102 and a Q component 104 of output frequency 25. The selectable divider 78 is operably coupled to divide, or multiple, the reference frequency 28 to produce the reference I frequency 108 and reference Q frequency 106. The I mixer 80 and Q mixer 84 sums the I and Q components of the quadrature module 110 with the reference I and Q frequencies 106 and 108, which are then summed via summing module 82.

FIG. 5 illustrates a schematic block diagram of yet another fractional-N synthesizer 120 that includes a processing module 122 and memory 124. The processing module 122 may be a single processing device or a plurality of processing devices. Such a processing device may be a microprocessor, microcomputer, microcontroller, digital signal processor, programmable gate array, programmable logic device, central processing unit, state machine, logic circuitry and/or any device that manipulates signals (analog and/or digital) based on operational instructions. The memory 124 may be a single memory device or a plurality of memory devices. Such a memory device may be read-only memory, random access memory, volatile memory, non-volatile memory, dynamic memory, static memory, flash memory, and/or any device that stores digital information. Note that when the processing module 122 implements one or more of its functions via a state machine or logic circuitry, the memory storing the corresponding operational instruction is embedded within the circuitry comprising the state machine or logic circuitry. The operational instructions stored in memory 124 and executed by processing module 122 are generally illustrated with reference to FIGS. 6 through 10.

FIG. 6 illustrates a logic diagram of a method for fractional-N synthesis. The process begins at Step 130 where a $1^{st}$ feedback frequency is generated from an output frequency based on a fixed divider value, a fractional value of a divider value and an integer value of the divider value. The divider value and the fixed divider value indicate a ratio between a reference frequency and the output frequency. The process then proceeds to Step 132 where a $2^{nd}$ feedback frequency is generated from the output frequency based on a selectable divider value, a modified fractional value of the divider value and a modified integer value of the divider value.

The process then proceeds to Step 134 where a determination is made as to whether the fractional value of the divider value is within a range of fractional values. Such a determination indicates whether the divider value is substantially equal to an integer value, which would cause the fractional-N synthesizer to produce fractional spurs. For example, when the divider value is substantially equal to an integer, it includes a fractional value that is outside the range of fractional values that would not cause fractional spurs.

If the fractional value is within the range of fractional values (i.e., would not cause fractional spurs), the process proceeds to Step 136 where the $1^{st}$ feedback frequency is utilized to produce the output frequency. If, however, the fractional value is not within the range of fractional values (i.e., would produce fractional spurs), the process proceeds to Step 138 where the $2^{nd}$ feedback frequency is used to produce the output frequency. As such, the $2^{nd}$ feedback frequency is produced utilizing a selected divider value and a modified divider value, which has a fractional portion that is within the range of fractional values. As such, the $2^{nd}$ feedback frequency produces the desired feedback frequency using a modified divider value to avoid the generation of fractional spurs.

Figures 7, 8:
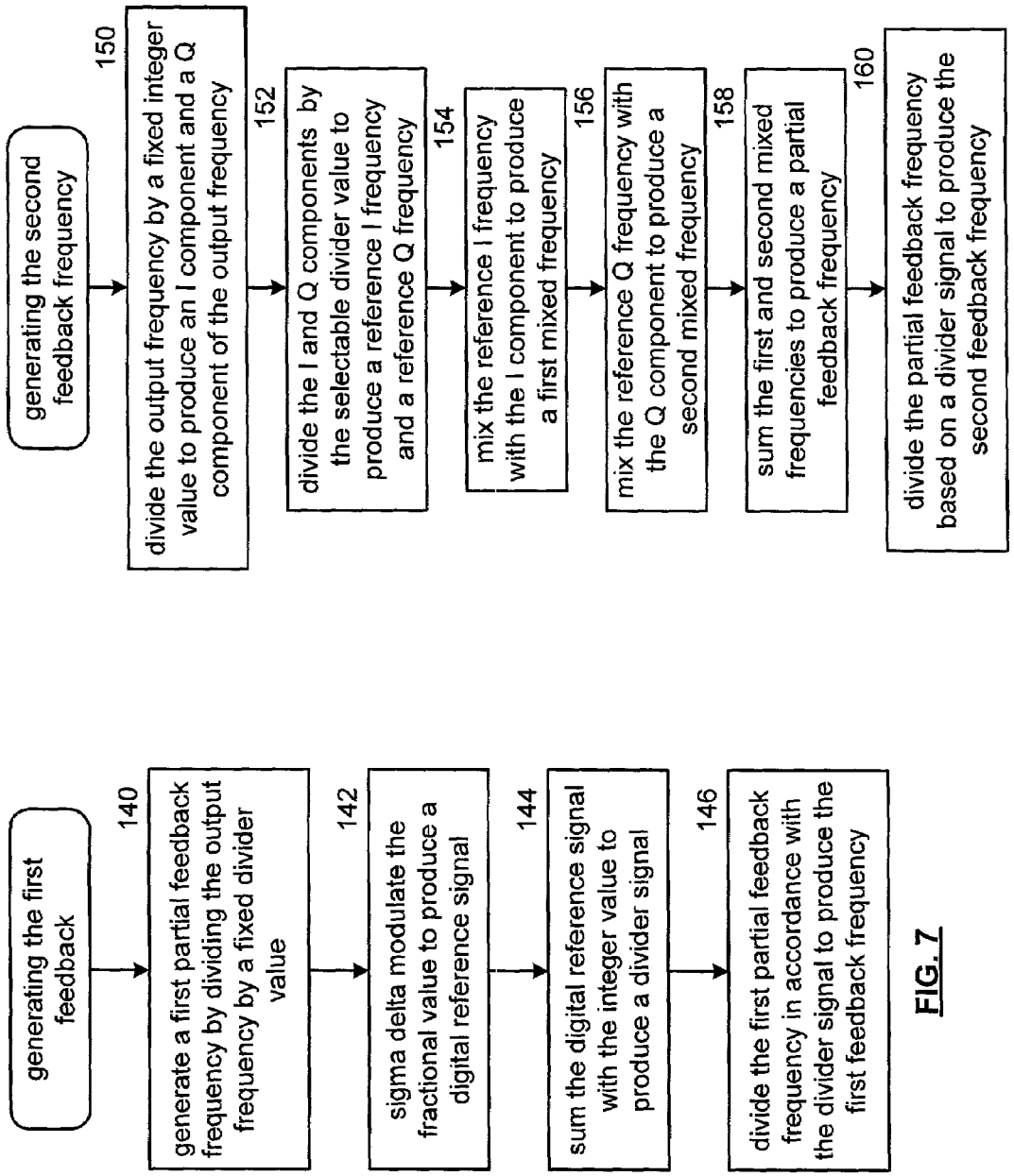

FIG. 7 illustrates a logic diagram for generating the $1^{st}$ feedback frequency. The process begins at Step 140 where a $1^{st}$ partial feedback frequency is generated by dividing the output frequency by a fixed divider value. The process then proceeds to Step 142 where the fractional value of the divider value is Sigma Delta modulated to produce a digital reference signal. The process then proceeds to Step 144 where the digital reference signal is summed with the integer value to produce a divider signal. The process then proceeds to Step 146 where the $1^{st}$ partial feedback frequency is divided in accordance with the divider signal to produce the $1^{st}$ feedback frequency from the output frequency. Such a process was graphically illustrated and described with reference to FIG. 2.

FIG. 8 illustrates a logic diagram for generating the $2^{nd}$ feedback frequency. The process begins at Step 150 where the output frequency is divided by a fixed integer value to produce an I component and a Q component of the output frequency. The process then proceeds to Step 152 where the I and Q components of the output frequency are divided by a selectable divider value to produce a reference I frequency and a reference Q frequency. The process then proceeds to Step 154 where the reference I frequency is mixed with the I component of the output frequency to produce a $1^{st}$ mixed frequency.

The process then proceeds to Step 156 where the reference Q frequency is mixed with the Q component of the output frequency to produce a $2^{nd}$ mixed frequency. The process then proceeds to Step 158 where the $1^{st}$ and $2^{nd}$ mixed frequencies are summed to produce a partial feedback frequency. The process then proceeds to Step 160 where the partial feedback frequency is divided based on a divider signal to produce the $2^{nd}$ feedback frequency from the output frequency. The divider signal may be generated by Sigma Delta modulating the modified fractional value to produce a digital reference signal. The digital reference signal may then be summed with the modified integer value of the modified divider value to produce the divider signal. The modified fractional value and the modified integer value may be determined based on the selected divider. This was previously illustrated and described with reference to FIG. 2.

FIG. 9 illustrates a logic diagram of an alternate method for generating the $2^{nd}$ feedback frequency. The process begins at Step 170 where the reference frequency is divided by a fixed integer value to produce an I component and a Q component of the reference frequency. The process then proceeds to Step 172 where the output frequency is divided by a $2^{nd}$ fixed integer value to produce an I component and a Q component of the output frequency. The process then proceeds to Step 174 where the I component of the output frequency is mixed with the I component of the reference frequency to produce a $1^{st}$ mixed frequency.

The process then proceeds to Step 176 where the Q component of the output frequency is mixed with the Q component of the reference frequency to produce a $2^{nd}$ mixed frequency. The process then proceeds to Step 178 where the $1^{st}$ and $2^{nd}$ mixed frequencies are summed to produce a partial feedback frequency. The process then proceeds to Step 180 where the partial feedback frequency is divided based on a divider signal to produce the $2^{nd}$ feedback signal, which is used to produce the $2^{nd}$ feedback frequency.

FIG. 10 illustrates a logic diagram of an alternate method for fractional-N synthesis. The process begins at Step 190 where a fractional value of a divider value is determined. Note that the divider value represents at least a portion of a ratio between a reference frequency and the desired output frequency. The process then proceeds to Step 192 where a determination is made as to whether the fractional value is outside a range of fractional values. When the fractional value is outside of the range, i.e., the divider value is substantially similar to an integer value, which may cause the fractional-N synthesizer to produce fractional spurs, the process proceeds to step 194. When the fractional value is within the range of fractional values, the fractional-N synthesizer will not generate fractional spurs, the process proceeds to step 202.

At Step 202, the feedback frequency is generated based on a fixed divider value, the fractional value and an integer value of the divider value. This may be done in accordance with the logic diagram illustrated in FIG. 7. Having generated the feedback frequency, it is compared with the reference frequency via a forward path, which subsequently produces the output frequency.

At Step 194, a partial divider value is selected. The process then proceeds to Step 196 where a modified fractional value and a modified integer value are determined for the divider value based on the partial divider value. The process then proceeds to Step 198 where a feedback frequency is generated based on the partial divider value, the modified fractional value and the modified integer value. This may be done utilizing the Steps illustrated in FIG. 8 or 9. The process then proceeds to Step 200 where the output frequency is generated from the reference frequency and the feedback frequency.

The preceding discussion has presented a method and apparatus for fractional-N synthesis. By utilizing a configurable feedback path, a variety of divider values may be used without causing fractional spurs to be produced. In addition, by setting the output frequency to less than the desired local oscillation frequency, the adverse affects of transmitter pulling can be avoided. As one of average skill in the art will appreciate, other embodiments may be derived from the teaching of the present invention without deviating from the scope of the claims.

What is claimed is:

1. A fractional-N synthesizer comprises:
   forward path operably coupled to produce an output frequency from a reference frequency and a feedback reference frequency that is based on a divider value;
   configurable feedback path operably coupled to produce the feedback frequency, wherein the configurable feedback path includes:
   first feedback path used to provide the feedback frequency when a fractional value of the divider value is within a range of fractional values;
   second feedback path used to provide the feedback frequency when the fractional value of the divider value is not within the range of fractional values; and
   a control module operable to generate a select signal to select between divider values produced by the first and second feedback paths as a part of providing the feedback frequency based, at least in part, a divided value that is produced by the first feedback path.

2. The fractional-N synthesizer of claim 1, wherein the forward path further comprises:
   phase-frequency detector operably coupled to receive the reference frequency and the feedback frequency, wherein the phase-frequency detector produces a difference signal based on the phase-frequency difference between the reference frequency and the feedback frequency;
   charge pump operably coupled to receive the difference signal and produce therefrom a charge-up signal or a charge-down signal;
   low pass filter operably coupled to filter the charge-up signal or the charge-down signal to produce a filtered signal; and
   controlled oscillator operably coupled to produce the output frequency based on the filtered signal.

3. The fractional-N synthesizer of claim 1, wherein the configurable feedback path further comprises:
   sigma delta modulator operably couple to receive the fractional value or a modified fractional value and produce therefrom a reference digital signal;
   summing module operably coupled to sum the reference digital signal with an integer value of the divider value or a modified integer value to produce a first divider select signal;
   multiplexor operably coupled to provide an output of the first feedback path as a partial feedback frequency when the fractional value of the divider value is within the range of fractional values and to provide an output of the second feedback path as the partial feedback frequency when the fractional value of the divider value is not within the range of fractional values; and selectable divider operably coupled to produce the feedback frequency from the partial feedback frequency based on the first divider select signal.

4. The fractional-N synthesizer of claim 3, wherein the first feedback path further comprises:

a fixed divider that divides the output frequency by a fixed integer value to produce the partial feedback frequency.

5. The fractional-N synthesizer of claim 4, wherein the fixed divider divides the output frequency by a fixed integer value to produce an I component and a Q component of the output frequency, wherein the second feedback path further comprises;

second selectable divider that divides the I and Q components of the output frequency by a selected divisor to produce a reference I frequency and a reference Q frequency;

I mixer operably coupled to mix the reference I frequency with the I component of the output frequency to produce a first mixed frequency;

Q mixer operably coupled to mix the reference Q frequency with the Q component of the output frequency to produce a second mixed frequency; and summing module that sum the first and second mixed frequencies to produce the partial feedback frequency.

6. The fractional-N synthesizer of claim 3, wherein the second feedback path further comprises:

quadrature module operably coupled to produce an I component and a Q component of the output frequency;

second selectable divider that divides the I and Q components of the output frequency by selected divisor to produce a reference I frequency and a reference Q frequency;

I mixer operably coupled to mix the reference I frequency with the I component of the output frequency to produce a first mixed frequency;

Q mixer operably coupled to mix the reference Q frequency with the Q component of the output frequency to produce a second mixed frequency; and summing module that sum the first and second mixed frequencies to produce the partial feedback frequency.

7. The fractional-N synthesizer of claim 3, second feedback path further comprises:

quadrature module operably coupled to produce an I component and a Q component of the output frequency;

second selectable divider that divides I and Q components of the reference frequency by selected divisor to produce a reference I frequency and a reference Q frequency;

I mixer operably coupled to mix the reference I frequency with the I component of the output frequency to produce a first mixed frequency;

Q mixer operably coupled to mix the reference Q frequency with the Q component of the output frequency to produce a second mixed frequency; and summing module that sum the first and second mixed frequencies to produce the partial feedback frequency.

8. The fractional-N synthesizer of claim 3 further comprises:

controller operably coupled to the configurable feedback path, wherein the controller determines when the fractional value of the divider value is within the range of fractional values, wherein the controller determines the modified fractional value and the modified integer value when the fractional value of the divider value is not within the range of fractional values, and wherein the controller generates a control signal that causes the multiplexor to provide the output of the first feedback path or the output of the second feedback path as the partial feedback frequency.

9. A method for fractional-N synthesis, the method comprises:

generating a first feedback frequency from an output frequency based on a fixed divider value, a fractional value of a divider value, and an integer value of a divider value, wherein the divider value and the fixed divider value indicate a ratio between a reference frequency and the output frequency;

generating a second feedback frequency from the output frequency based on a selectable divider value, a modified fractional value of the divider value, and a modified integer value of the divider value;

utilizing the first feedback frequency to produce the output frequency when the fractional value is within a range of fractional values;

utilizing the second feedback frequency to produce the output frequency when the fractional value is not within the range of fractional values;

generating a select signal to select between divider values produced by first and second feedback paths as a part of utilizing one of the first and second feedback frequencies based, at least in part, a divided value that is produced by the first feedback path.

10. The method of claim 9, wherein the generating the first feedback frequency further comprises:

generating a first partial feedback frequency by dividing the output frequency by a fixed divider value;

sigma delta modulating the fractional value to produce a digital reference signal;

summing the digital reference signal with the integer value to produce a divider signal;

dividing the first partial feedback frequency in accordance with the divider signal to produce the first feedback frequency.

11. The method of claim 9, wherein the generating the second feedback frequency further comprises:

dividing the output frequency by a fixed integer value to produce an I component and a Q component of the output frequency;

dividing the I and Q components of the output frequency by the selectable divider value to produce a reference I frequency and a reference Q frequency;

mixing the reference I frequency with the I component of the output frequency to produce a first mixed frequency;

mixing the reference Q frequency with the Q component of the output frequency to produce a second mixed frequency;

summing the first and second mixed frequencies to produce a partial feedback frequency; and dividing the partial feedback frequency based on a divider signal to produce the second feedback frequency.

12. The method of claim 11 further comprises:

sigma delta modulating the modified fractional value to produce a digital reference signal; and summing the digital reference signal with the modified integer value to produce the divider signal.

13. The method of claim 12 further comprises:

determining the modified fractional value based on the selected divider value; and determining the modified integer value based on the selected divider value.

14. The method of claim 9, wherein the generating the second feedback frequency further comprises:
- dividing the reference frequency by a fixed integer value to produce an I component and a Q component of the reference frequency;
- dividing the output frequency by a second fixed integer value to produce an I component and a Q component of the output frequency;
- mixing the I component of the output frequency with the I component of the reference frequency to produce a first mixed frequency;
- mixing the Q component of the output frequency with the Q component of the reference frequency to produce a second mixed frequency;
- summing the first and second mixed frequencies to produce a partial feedback frequency; and
- dividing the partial feedback frequency based on a divider signal to produce the second feedback signal.

15. A method for fractional-N synthesis, the method comprises:
- determining a fractional value of divider value, wherein the divider value represents at least a portion of a ratio between a reference frequency and an output frequency;
- when the fractional value is outside a range of fractional values, selecting a partial divider value;
- determining a modified fractional value and a modified integer value of the divider value based on the partial divider value;
- generating a feedback frequency based on the partial divider value, the modified fractional value, and the modified integer value;
- generating a select signal to select between divider values produced by first and second feedback paths as a part of generating the feedback frequency based, at least in part, a divided value that is produced by the first feedback path; and
- generating the output frequency from the reference frequency and the feedback frequency.

16. The method of claim 15 further comprises:
- when the fractional value is within the range of fractional values, generating the feedback frequency based on a fixed divider value, the fractional value, and an integer value of the divider value.

17. The method of claim 16, wherein the generating the feedback frequency further comprises:
- generating a first partial feedback frequency by dividing the output frequency by the fixed divider value;
- sigma delta modulating the fractional value to produce a digital reference signal;
- summing the digital reference signal with the integer value to produce a divider signal; and
- dividing the first partial feedback frequency in accordance with the divider signal to produce the feedback frequency.

18. The method of claim 15, wherein the generating the feedback frequency further comprises:
- dividing the output frequency by a fixed integer value to produce an I component and a Q component of the output frequency;
- dividing the I and Q components of the output frequency by the partial divider value to produce a reference I frequency and a reference Q frequency;
- mixing the reference I frequency with the I component of the output frequency to produce a first mixed frequency;
- mixing the reference Q frequency with the Q component of the output frequency to produce a second mixed frequency;
- summing the first and second mixed frequencies to produce a partial feedback frequency; and
- dividing the partial feedback frequency based on a divider signal to produce the feedback frequency.

19. The method of claim 18 further comprises:
- sigma delta modulating the modified fractional value to produce a digital reference signal; and
- summing the digital reference signal with the modified integer value to produce the divider signal.

20. The method of claim 15, wherein the generating the feedback frequency further comprises:
- dividing the reference frequency by a fixed integer value to produce an I component and a Q component of the reference frequency;
- dividing the output frequency by a second fixed integer value to produce an I component and a Q component of the output frequency;
- mixing the I component of the output frequency with the I component of the reference frequency to produce a first mixed frequency;
- mixing the Q component of the output frequency with the Q component of the reference frequency to produce a second mixed frequency;
- summing the first and second mixed frequencies to produce a partial feedback frequency; and
- dividing the partial feedback frequency based on a divider signal to produce the second feedback signal.

21. A fractional-N synthesizer comprises:
processing module; and
memory operably coupled to the processing module, wherein the memory includes operational instructions that cause the processing module to:
- generate a first feedback frequency from an output frequency based on a fixed divider value, a fractional value of a divider value, and an integer value of the divider value, wherein the divider value and the fixed divider value indicate a ratio between a reference frequency and the output frequency;
- generate a second feedback frequency from the output frequency based on a selectable divider value, a modified fractional value of the divider value, and a modified integer value of the divider value;
- utilize the first feedback frequency to produce the output frequency when the fractional value is within a range of fractional values;
- utilize the second feedback frequency to produce the output frequency when the fractional value is not within the range of fractional values; and
- generate a select signal to select between divider values produced by first and second feedback paths as a part of utilizing one of the first and second feedback frequencies based, at least in part, a divided value that is produced by the first feedback path.

22. The fractional-N synthesizer of claim 21, wherein the memory further comprises operational instructions that cause the processing module to generate the first feedback frequency by:
- generating a first partial feedback frequency by dividing the output frequency by a fixed divider value;
- sigma delta modulating the fractional value to produce a digital reference signal;
- summing the digital reference signal with the integer value to produce a divider signal;

dividing the first partial feedback frequency in accordance with the divider signal to produce the first feedback frequency.

23. The fractional-N synthesizer of claim 21, wherein the memory further comprises operational instructions that cause the processing module to generate the second feedback frequency by:
dividing the output frequency by a fixed integer value to produce an I component and a Q component of the output frequency;
dividing the I and Q components of the output frequency by the selectable divider value to produce a reference I frequency and a reference Q frequency;
mixing the reference I frequency with the I component of the output frequency to produce a first mixed frequency;
mixing the reference Q frequency with the Q component of the output frequency to produce a second mixed frequency;
summing the first and second mixed frequencies to produce a partial feedback frequency; and dividing the partial feedback frequency based on a divider signal to produce the second feedback frequency.

24. The fractional-N synthesizer of claim 23, wherein the memory further comprises operational instructions that cause the processing module to:
sigma delta modulate the modified fractional value to produce a digital reference signal; and
sum the digital reference signal with the modified integer value to produce the divider signal.

25. The fractional-N synthesizer of claim 24, wherein the memory further comprises operational instructions that cause the processing module to:
determine the modified fractional value based on the selected divider value; and
determine the modified integer value based on the selected divider value.

26. The fractional-N synthesizer of claim 21, wherein the memory further comprises operational instructions that cause the processing module to generate the second feedback frequency by:
dividing the reference frequency by a fixed integer value to produce an I component and a Q component of the reference frequency;
dividing the output frequency by a second fixed integer value to produce an I component and a Q component of the output frequency;
mixing the I component of the output frequency with the I component of the reference frequency to produce a first mixed frequency;
mixing the Q component of the output frequency with the Q component of the reference frequency to produce a second mixed frequency;
summing the first and second mixed frequencies to produce a partial feedback frequency; and
dividing the partial feedback frequency based on a divider signal to produce the second feedback signal.

27. A fractional-N synthesizer comprises:
processing module; and
memory operably coupled to the processing module, wherein the memory includes operational instructions that cause the processing module to:
determine a fractional value of divider value, wherein the divider value represents at least a portion of a ratio between a reference frequency and an output frequency;
when the fractional value is outside a range of fractional values, select a partial divider value;
determine a modified fractional value and a modified integer value of the divider value based on the partial divider value;
generate a feedback frequency based on the partial divider value, the modified fractional value, and the modified integer value;
generate a select signal to select between divider values produced by first and second feedback paths as a part of utilizing one of the first and second feedback frequencies based, at least in part, a divided value that is produced by the first feedback path; and
generate the output frequency from the reference frequency and the feedback frequency.

28. The fractional-N synthesizer of claim 27, wherein the memory further comprises operational instructions that cause the processing module to:
when the fractional value is within the range of fractional values, generate the feedback frequency based on a fixed divider value, the fractional value, and an integer value of the divider value.

29. The fractional-N synthesizer of claim 28, wherein the memory further comprises operational instructions that cause the processing module to generate the feedback frequency by:
generating a first partial feedback frequency by dividing the output frequency by the fixed divider value;
sigma delta modulating the fractional value to produce a digital reference signal;
summing the digital reference signal with the integer value to produce a divider signal; and
dividing the first partial feedback frequency in accordance with the divider signal to produce the feedback frequency.

30. The fractional-N synthesizer of claim 27, wherein the memory further comprises operational instructions that cause the processing module to generate the feedback frequency by:
dividing the output frequency by a fixed integer value to produce an I component and a Q component of the output frequency;
dividing the I and Q components of the output frequency by the partial divider value to produce a reference I frequency and a reference Q frequency;
mixing the reference I frequency with the I component of the output frequency to produce a first mixed frequency;
mixing the reference Q frequency with the Q component of the output frequency to produce a second mixed frequency;
summing the first and second mixed frequencies to produce a partial feedback frequency; and
dividing the partial feedback frequency based on a divider signal to produce the feedback frequency.

31. The fractional-N synthesizer of claim 30, wherein the memory further comprises operational instructions that cause the processing module to:
sigma delta modulate the modified fractional value to produce a digital reference signal; and
sum the digital reference signal with the modified integer value to produce the divider signal.

32. The fractional-N synthesizer of claim 27, wherein the memory further comprises operational instructions that cause the processing module to generate the feedback frequency by:

dividing the reference frequency by a fixed integer value to produce an I component and a Q component of the reference frequency;
dividing the output frequency by a second fixed integer value to produce an I component and a Q component of the output frequency;
mixing the I component of the output frequency with the I component of the reference frequency to produce a first mixed frequency;
mixing the Q component of the output frequency with the Q component of the reference frequency to produce a second mixed frequency;
summing the first and second mixed frequencies to produce a partial feedback frequency; and
dividing the partial feedback frequency based on a divider signal to produce the second feedback signal.

33. An integrated radio comprises:
radio frequency receiver section operably coupled to receive an inbound radio frequency signal and a clock signal, wherein the radio frequency receiver section converts the inbound radio frequency signal into an inbound intermediate frequency signal;
radio frequency transmitter section operably coupled to receive an outbound intermediate frequency signal and the clock signal, wherein the radio frequency transmitter section converts the outbound intermediate frequency signal into an outbound radio frequency signal;
oscillation module operably coupled to produce a reference frequency;
local oscillator that includes:
summing module;
divider module;
a fractional-N synthesizer that includes:
forward path operably coupled to produce an output frequency from the reference frequency and a feedback reference frequency that is based on a divider value;
configurable feedback path operably coupled to produce the feedback frequency, wherein the configurable feedback path includes:
first feedback path used to provide the feedback frequency when a fractional value of the divider value is within a range of fractional values;
second feedback path used provide the feedback frequency when the fractional value of the divider value is not within the range of fractional values, wherein the divider module divides the output frequency to produce a divided frequency and wherein the summing module sums the output frequency and the divided frequency to produce the clock signal; and
logic operable to generate a select signal to select between divider values produced by the first and second feedback paths as a part of utilizing one of the first and second feedback frequencies based, at least in part, a divided value that is produced by the first feedback path.

34. The integrated radio of claim 33 further comprises:
the radio frequency receiver section operable to convert the inbound radio frequency signal into one of a plurality of inbound intermediate frequency signals, wherein the plurality of inbound intermediate frequency signals includes the inbound intermediate frequency signal; and
the radio frequency transmitter section operable to convert one of a plurality of outbound intermediate frequency signals into the outbound radio frequency signal, wherein the plurality of outbound intermediate frequency signals includes the outbound intermediate frequency signal.

35. The integrated radio of claim 33, wherein the forward path further comprises:
phase-frequency detector operably coupled to receive the reference frequency and the feedback frequency, wherein the phase-frequency detector produces a difference signal based on the phase-frequency difference between the reference frequency and the feedback frequency;
charge pump operably coupled to receive the difference signal and produce therefrom a charge-up signal or a charge-down signal;
low pass filter operably coupled to filter the charge-up signal or the charge-down signal to produce a filtered signal; and
controlled oscillator operably coupled to produce the clock signal based on the filtered signal.

36. The integrated radio of claim 33, wherein the configurable feedback path further comprises:
sigma delta modulator operably couple to receive the fractional value or a modified fractional value and produce therefrom a reference digital signal;
summing module operably coupled to sum the reference digital signal with an integer value of the divider value or a modified integer value to produce a first divider select signal;
multiplexor operably coupled to provide an output of the first feedback path as a partial feedback frequency when the fractional value of the divider value is within the range of fractional values and to provide an output of the second feedback path as the partial feedback frequency when the fractional value of the divider value is not within the range of fractional values; and
selectable divider operably coupled to produce the feedback frequency from the partial feedback frequency based on the first divider select signal.

37. The integrated radio of claim 36, wherein the first feedback path further comprises:
a fixed divider that divides the clock signal by a fixed integer value to produce the partial feedback frequency.

38. The integrated radio of claim 37, wherein the fixed divider divides the clock signal by a fixed integer value to produce an I component and a Q component of the output frequency, wherein the second feedback path further comprises;
second selectable divider that divides the I and Q components of the clock signal by a selected divisor to produce a reference I frequency and a reference Q frequency;
I mixer operably coupled to mix the reference I frequency with the I component of the clock signal to produce a first mixed frequency;
Q mixer operably coupled to mix the reference Q frequency with the Q component of the clock signal to produce a second mixed frequency; and
summing module that sum the first and second mixed frequencies to produce the partial feedback frequency.

39. The integrated radio of claim 36, wherein the second feedback path further comprises:
quadrature module operably coupled to produce an I component and a Q component of the clock signal;

second selectable divider that divides the I and Q components of the clock signal by selected divisor to produce a reference I frequency and a reference Q frequency;

I mixer operably coupled to mix the reference I frequency with the I component of the clock signal to produce a first mixed frequency;

Q mixer operably coupled to mix the reference Q frequency with the Q component of the clock signal to produce a second mixed frequency; and summing module that sum the first and second mixed frequencies to produce the partial feedback frequency.

40. The integrated radio of claim 36, second feedback path further comprises:

quadrature module operably coupled to produce an I component and a Q component of the reference frequency;

second selectable divider that divides the I and Q components of the reference frequency by selected divisor to produce a reference I frequency and a reference Q frequency;

I mixer operably coupled to mix the reference I frequency with the I component of the clock signal to produce a first mixed frequency;

Q mixer operably coupled to mix the reference Q frequency with the Q component of the clock signal to produce a second mixed frequency; and summing module that sum the first and second mixed frequencies to produce the partial feedback frequency.

41. The integrated radio of claim 36 further comprises:

controller operably coupled to the configurable feedback path, wherein the controller determines when the fractional value of the divider value is within the range of fractional values, wherein the controller determines the modified fractional value and the modified integer value when the fractional value of the divider value is not within the range of fractional values, and wherein the controller generates a control signal that causes the multiplexor to provide the output of the first feedback path or the output of the second feedback path as the partial feedback frequency.

* * * * *

UNITED STATES PATENT AND TRADEMARK OFFICE
CERTIFICATE OF CORRECTION

| | |
|---|---|
| PATENT NO. | : 7,231,196 B2 |
| APPLICATION NO. | : 10/015993 |
| DATED | : June 12, 2007 |
| INVENTOR(S) | : Hung-Ming Chien et al. |

It is certified that error appears in the above-identified patent and that said Letters Patent is hereby corrected as shown below:

Column 12, line 23, in Claim 9: replace "values;" with --values; and--

Signed and Sealed this

Fourteenth Day of October, 2008

JON W. DUDAS
*Director of the United States Patent and Trademark Office*